US012573822B2

(12) United States Patent
Uki

(10) Patent No.: US 12,573,822 B2
(45) Date of Patent: Mar. 10, 2026

(54) ELECTRIC JUNCTION BOX

(71) Applicant: YAZAKI CORPORATION, Tokyo (JP)

(72) Inventor: Kazutaka Uki, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 21 days.

(21) Appl. No.: 18/799,529

(22) Filed: Aug. 9, 2024

(65) Prior Publication Data

US 2025/0079812 A1 Mar. 6, 2025

(30) Foreign Application Priority Data

Sep. 6, 2023 (JP) ................................. 2023-144571

(51) Int. Cl.
| | |
|---|---|
| *H05K 7/20* | (2006.01) |
| *B60R 16/023* | (2006.01) |
| *H02G 3/03* | (2006.01) |
| *H02G 3/08* | (2006.01) |

(52) U.S. Cl.
CPC ........... *H02G 3/03* (2013.01); *B60R 16/0239* (2013.01); *H02G 3/08* (2013.01); *H05K 7/2039* (2013.01)

(58) Field of Classification Search
CPC .......................... B60R 16/0239; H05K 7/2039
See application file for complete search history.

(56) References Cited

U.S. PATENT DOCUMENTS

| | | | | |
|---|---|---|---|---|
| 10,263,405 | B2 * | 4/2019 | Chin | ................... B60R 16/0238 |
| 2018/0083375 | A1 * | 3/2018 | Matsumura | ......... B60R 16/0238 |
| 2019/0214805 | A1 | 7/2019 | Hiramitsu et al. | |
| 2021/0101545 | A1 * | 4/2021 | Kurata | ................ B60R 16/0239 |
| 2022/0085587 | A1 | 3/2022 | Munezuka et al. | |
| 2024/0088636 | A1 * | 3/2024 | Yoshimura | ............. H02G 3/081 |
| 2024/0186777 | A1 * | 6/2024 | Katsuse | ................... H05K 5/02 |

FOREIGN PATENT DOCUMENTS

| | | |
|---|---|---|
| JP | H09-321458 A | 12/1997 |
| JP | 2001-168560 A | 6/2001 |
| JP | 2004-186504 A | 7/2004 |
| JP | 2022-047797 A | 3/2022 |
| WO | 2018/043073 A1 | 3/2018 |

* cited by examiner

*Primary Examiner* — Hung V Ngo
(74) *Attorney, Agent, or Firm* — KENEALY VAIDYA LLP

(57) ABSTRACT

An electric junction box includes: a first cooling member and a second cooling member; and a conductive member disposed to be sandwiched between the first and second cooling members. The conductive member includes a housing portion, an electronic component disposed inside the housing portion, and busbars being provided on a first mounting wall and a second mounting wall, and the conductive member is disposed such that an outer surface of the first mounting wall faces the outer surface of the first cooling member and an outer surface of the second mounting wall faces the outer surface of the second cooling member. The electronic component includes a plurality of terminals, and a movable contact point, and the electronic component is configured in such a manner that the movable contact point is located at a position farther away from the side wall than the plurality of terminals in the electronic component.

3 Claims, 4 Drawing Sheets

ELECTRIC JUNCTION BOX

CROSS-REFERENCE TO RELATED APPLICATION(S)

This application is based upon and claims the benefit of priority from prior Japanese patent application No. 2023-144571 filed on Sep. 6, 2023, the entire contents of which are incorporated herein by reference.

BACKGROUND

1. Field of the Invention

The present disclosure relates to an electric junction box that includes a pair of cooling members capable of absorbing heat from an outer surface and dissipating heat to the outside, and a conductive member disposed to be sandwiched between the cooling members.

2. Description of the Related Art

An electric junction box to be mounted on a vehicle or the like has been proposed in the related art. For example, an electric junction box in the related art has a box shape as a whole, and includes a busbar connected to an external power supply or the like, an electronic component connected to the busbar such as a relay or a fuse, and a case accommodating the busbar and the electronic component (for example, see JP2022-047797A).

However, in the above-described type of electric junction box, in general, when the electronic component (particularly, the relay or the fuse) is operated, Joule heat associated with energization is generated in an internal circuit of the electronic component, the busbar, and the like. From the viewpoint of appropriately operating the electronic component over a long period of time, it is desirable to efficiently dissipate such heat generated at various locations during energization to the outside.

SUMMARY

An object of the present disclosure is to provide an electric junction box having excellent heat dissipation.

In order to achieve the object described above, an electric junction box according to the present disclosure is characterized as follows.

According to an aspect of the present disclosure, there is provided an electric junction box including: a first cooling member and a second cooling member that are capable of absorbing heat from an outer surface and dissipating heat to the outside; and a conductive member disposed to be sandwiched between the first cooling member and the second cooling member, in which: the conductive member includes a housing portion having a box shape, an electronic component disposed inside the housing portion, and busbars that are provided on a first mounting wall and a second mounting wall as two box walls of the housing portion and are electrically connected to the electronic component, and the conductive member is disposed such that an outer surface of the first mounting wall faces the outer surface of the first cooling member and an outer surface of the second mounting wall faces the outer surface of the second cooling member; and the electronic component includes a plurality of terminals that are provided on a side wall of the electronic component and are connected to the busbars, and a movable contact point that is provided inside the electronic component and is capable of mechanically switching a conductive state and a non-conductive state between predetermined terminals among the plurality of terminals, and the electronic component is configured in such a manner that the movable contact point is located at a position farther away from the side wall than the plurality of terminals in the electronic component.

According to the electric junction box of the present disclosure, the conductive member incorporating the electronic component and the busbars is disposed to be sandwiched between the first cooling member and the second cooling member such that the outer surfaces of the first mounting wall and the second mounting wall of the conductive member provided with the busbars respectively face the outer surfaces of the first cooling member and the second cooling member. Accordingly, Joule heat, which is generated in an internal circuit of the electronic component, contact points between the electronic component and the busbars, and the busbars during energization, is easily absorbed by the first cooling member and the second cooling member through the mounting walls. Further, the conductive member is disposed to be sandwiched between the first cooling member and the second cooling member, and thus a heat absorption capability of the entire electric junction box can be improved as compared with a case in which only one cooling member is used for heat absorption. Therefore, the electric junction box having the present configuration has excellent heat dissipation.

Further, when the electric junction box is used in a posture in which the outer surface of the first cooling member performing the above-described heat absorption and the first mounting wall of the conductive member extend in a vertical direction (an upper-lower direction), the terminals and the movable contact point are disposed to be aligned in a direction (for example, a lateral direction) intersecting the vertical direction in the electronic component connected to the busbar provided on the first mounting wall. Therefore, for example, even in a case in which a component around the movable contact point falls off due to aged deterioration, an excessive external force, or the like, the component falls downward in the vertical direction, and thus it is possible to avoid the component from interfering with the switching of the conductive state and the non-conductive state between the movable contact point and the terminals. The same also applies to the busbar provided on the second mounting wall.

The present disclosure has been briefly described above. Further, the details of the present disclosure can be clarified by reading modes (hereinafter, referred to as "embodiments") for carrying out the disclosure described below with reference to the accompanying drawings.

BRIEF DESCRIPTION OF THE DRAWINGS

The present disclosure will become more fully understood from the detailed description given hereinbelow and the accompanying drawing which is given by way of illustration only, and thus is not limitative of the present disclosure and wherein.

DETAILED DESCRIPTION OF THE INVENTION

Embodiments

Figure 1:
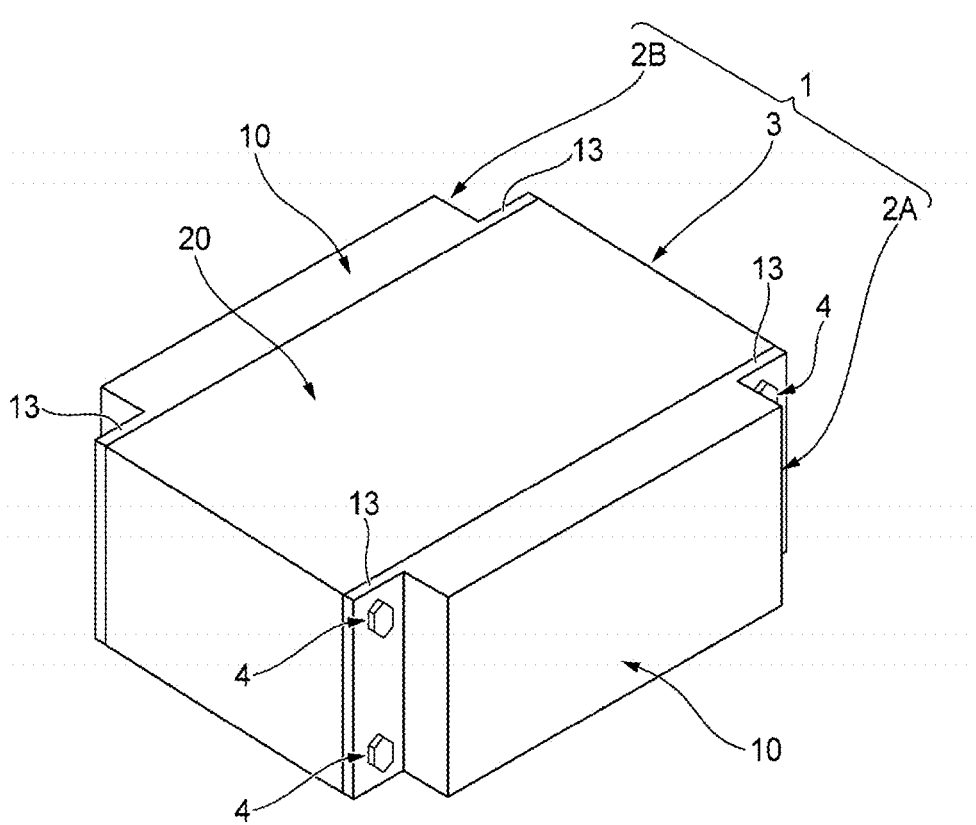
FIG. 1 is a perspective view showing an electric junction box according to an embodiment of the present disclosure.
Figure 1:
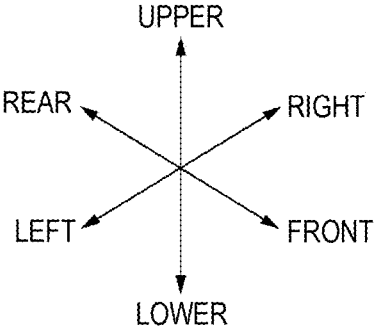

Hereinafter, an electric junction box 1 according to an embodiment of the present disclosure will be described with reference to the drawings. The electric junction box 1 is typically mounted on a vehicle and is used. For example, a junction box, a relay box, and the like can be used as the electric junction box 1, but the electric junction box 1 is not limited thereto. As shown in FIG. 1 and the like, the electric junction box 1 includes a pair of cooling members 2A and 2B, and a conductive member 3 disposed to be sandwiched between the pair of cooling members 2A and 2B. The pair of cooling members 2A and 2B and the conductive member 3 are fixed to each other by fastening using bolts 4.

Hereinafter, for convenience of description, as shown in FIGS. 1 to 4, a "front-rear direction", a "left-right direction", and an "upper-lower direction" are defined. The "front-rear direction", the "left-right direction", and the "upper-lower direction" are orthogonal to one another. The "upper-lower direction" matches an upper-lower direction (a vertical direction) of the vehicle when the electric junction box 1 is mounted on the vehicle. The "front-rear direction" and the "left-right direction" are merely defined for convenience of description, and do not necessarily match a front-rear direction and a left-right direction of the vehicle when the electric junction box 1 is mounted on the vehicle. Hereinafter, the components constituting the electric junction box 1 will be described in order.

Figure 2:
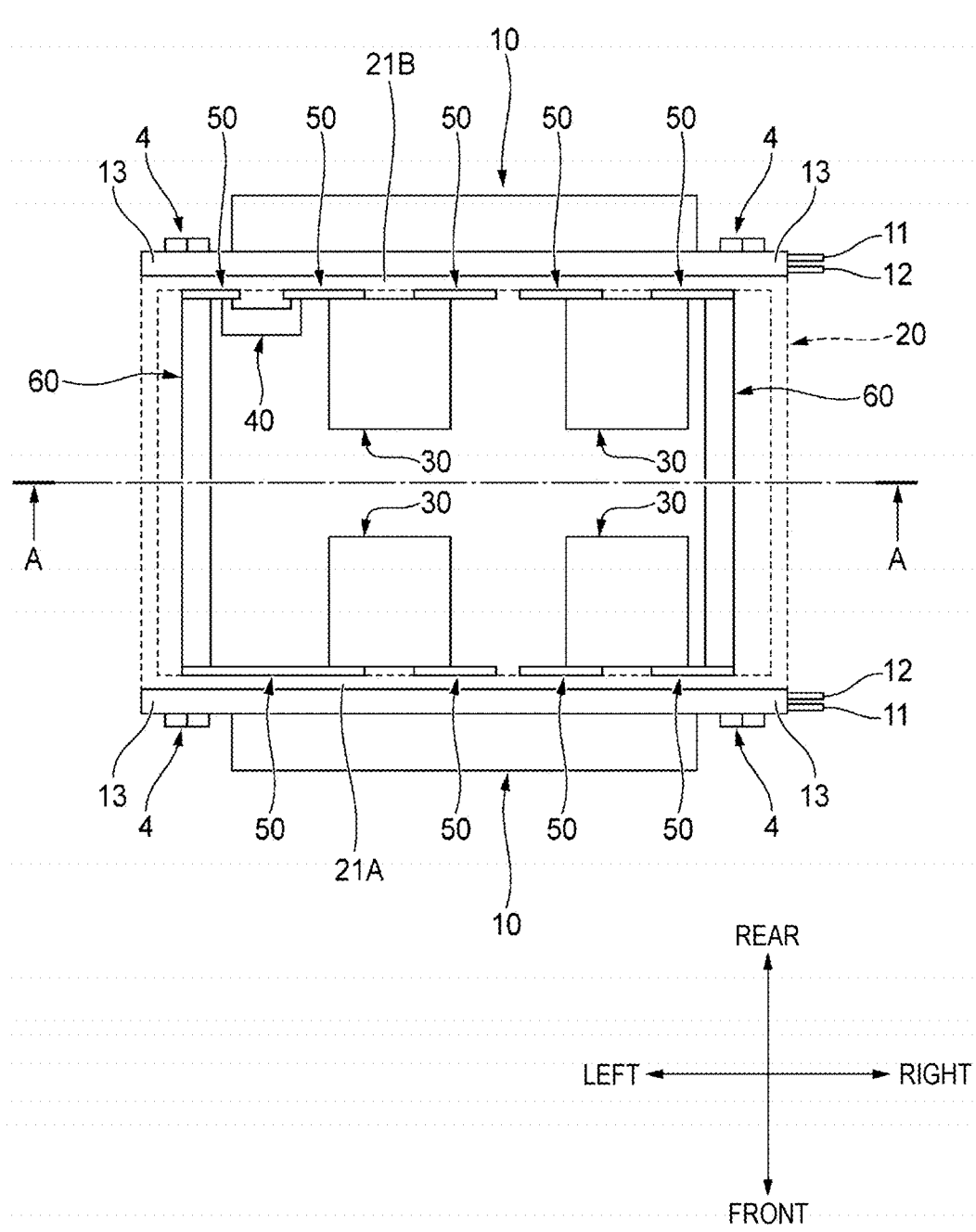
FIG. 2 is a top view of the electric junction box shown in FIG. 1 as seen through a housing portion of a conductive member.

First, the pair of cooling members 2A and 2B will be described. As shown in FIGS. 1 and 2, the pair of cooling members 2A and 2B have the same outer shape and the same structure. The pair of cooling members 2A and 2B are disposed to sandwich the conductive member 3 in the front-rear direction in a state in which orientations in the front-rear direction are opposite to each other (a state in which each two corresponding flange portions 13 to be described later face each other in the front-rear direction). Hereinafter, only the cooling member 2A of the pair of cooling members 2A and 2B will be described, and the description of the cooling element 2B will be omitted.

As shown in FIGS. 1 and 2, the cooling member 2A has a rectangular main body portion 10 extending in the left-right direction and the upper-lower direction and being thin in the front-rear direction. The main body portion 10 is made of, for example, a metal or a resin. An inlet passage 11 and an outlet passage 12 communicating with the inside of the main body portion 10 are provided on a right side wall of the main body portion 10, and the inlet passage 11 and the outlet passage 12 are connected to a radiator (not shown) located outside the cooling member 2A. A cooling water cooled by the radiator is introduced into the main body portion 10 through the inlet passage 11 by a pump (not shown) or the like, and absorbs heat from the outside through an outer wall of the main body portion 10. The cooling water that has absorbed (been heated) heat is returned from the inside of the main body portion 10 to the radiator through the outlet passage 12, and is cooled again. By repeating such a cycle, the cooling member 2A functions to absorb heat from an outer surface of the main body portion 10 and dissipate heat to the outside. Among outer walls of the main body portion 10, only a rear side wall facing the conductive member 3 to be cooled may be made of a metal having an excellent heat transfer property, and other outer walls may be made of a low-cost and lightweight resin.

A pair of left and right flange portions 13 are provided on the main body portion 10 to extend continuously outward from the rear side wall in the left-right direction. A plurality of through holes (not shown) through which the bolts 4 are inserted are provided in each flange portion 13 to be aligned in the upper-lower direction. The flange portion 13 is a portion used for the above-described fastening using the bolts 4.

Figure 3:
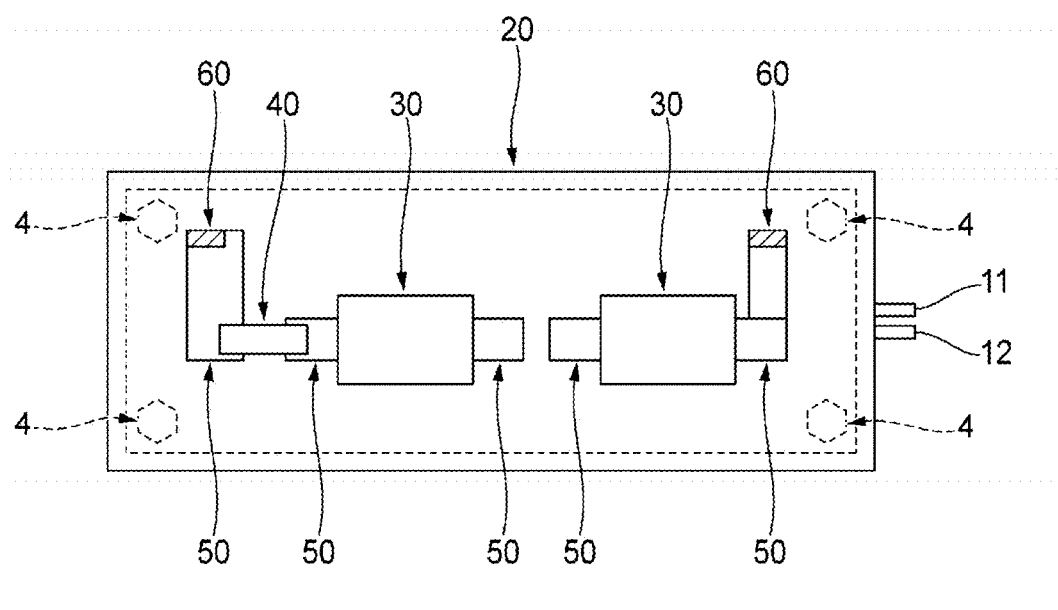
FIG. 3 is a cross-sectional view taken along an A-A line in FIG. 2 as seen through the housing portion of the conductive member.
Figure 3:
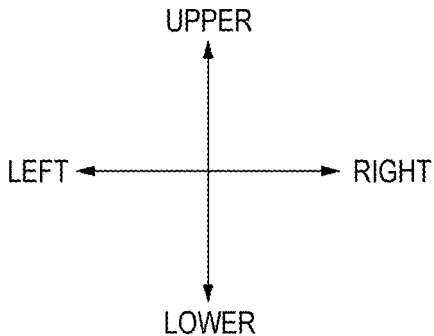

Next, the conductive member 3 will be described. As shown in FIGS. 1 to 3, the conductive member 3 includes a housing portion 20 having a box shape, a plurality of relays 30 and a fuse 40 disposed inside the housing portion 20, and a plurality of busbars 50 that are provided on mounting walls 21A and 21B as two box walls of the housing portion 20 and are electrically connected to the plurality of relays 30 and the fuse 40.

The housing portion 20 has a rectangular box shape extending in the left-right direction and the upper-lower direction and being thick in the front-rear direction. For example, the housing portion 20 is made of a resin. A front side wall (a rectangular flat plate-shaped wall extending in the left-right direction and the upper-lower direction that is disposed to face a rear side wall of the cooling member 2A) of the housing portion 20 functions as the mounting wall 21A provided with the busbars 50, and a rear side wall (a rectangular flat plate-shaped wall extending in the left-right direction and the upper-lower direction that is disposed to face a front side wall of the cooling member 2B) of the housing portion 20 functions as the mounting wall 21B provided with the busbars 50 (see FIGS. 2 and 4). A plurality of through holes 23 penetrating from the inside to the outside of the mounting walls 21A and 21B are formed in portions of the mounting walls 21A and 21B in which the busbars 50 are provided (see FIG. 4). An operation achieved by providing such through holes 23 will be described later.

As shown in FIG. 2, in the housing portion 20, two relays 30 are disposed to be aligned in the left-right direction along an inner surface of the mounting wall 21A in the vicinity of the inner surface of the mounting wall 21A, and two relays 30 and one fuse 40 are disposed to be aligned in the left-right direction along an inner surface of the mounting wall 21B in the vicinity of the inner surface of the mounting wall 21B. The relay 30 is a component that performs a switching function of turning ON and OFF the energization, and the fuse 40 is a component that performs a fuse function of turning OFF the energization when a current exceeding a rated current flows. The plurality of flat plate-shaped busbars 50 are provided on the mounting walls 21A and 21B to respectively face the inner surfaces of the mounting walls 21A and 21B and to be aligned in the left-right direction along the inner surfaces. Specifically, the plurality of busbars 50 are disposed such that a pair of right and left busbars 50 corresponding to each of the relays 30 and the fuse 40 are electrically connected. One busbar 50 provided on the mounting wall 21A and one busbar 50 provided on the mounting wall 21B are electrically connected to each other by a connection busbar 60 provided inside the housing portion 20 (see FIG. 2). The busbars 50 may be connected to each other by using an electric wire instead of the connection busbar 60.

Hereinafter, an internal structure of the relay 30 and a connection structure between the relay 30 and the pair of busbars 50 will be briefly described with reference to FIG. 4. The relay 30 includes a pair of metal terminals 31 provided to protrude to the outside from one side wall (a front side wall) of a housing of the relay 30, a metal movable contact point 32 provided inside the housing of the relay 30 and capable of mechanically switching a conductive state and a non-conductive state between the plurality of terminals 31, a coil 33 provided inside the housing of the relay 30 and driving the movable contact point 32, and a contact spring 35 provided inside the housing of the relay 30 and disposed between a core 34 of the coil 33 and the movable contact point 32. The contact spring 35 constantly biases the movable contact point 32 to a conduction side (the front side). When the coil 33 is energized, the coil 33 exerts an attractive force for driving the movable contact point 32 to a non-conduction side (the rear side) against a biasing force of the contact spring 35. As described above, the relay 30 can mechanically switch the conductive state and the non-conductive state between the plurality of terminals 31 by switching non-energization and energization to the coil 33. Therefore, the movable contact point 32 is located at a position (a position on the rear side) farther away from one side wall (the front side wall) of the housing of the relay 30 than the plurality of terminals 31, and the plurality of terminals 31 and the movable contact point 32 are located to be aligned in the front-rear direction. Therefore, for example, even in a case in which a component (for example, the coil 33) around the movable contact point 32 falls off due to aged deterioration, an excessive external force, or the like, the component falls downward in the vertical direction, and thus it is possible to avoid the component from interfering with the switching between the conductive state and the non-conductive state between the movable contact point 32 and the plurality of terminals 31.

Each of the plurality of terminals 31 of the relay 30 is fastened and fixed to the corresponding busbar 50 by a metal nut 51 in a recess of corresponding one of the pair of corresponding busbars 50. Accordingly, the pair of busbars 50 and the relay 30 are fixed to each other, and the pair of busbars 50 are electrically connected to the relay 30. The components constituting the electric junction box 1 have been described above.

Next, the assembly of the electric junction box 1 will be described. In order to assemble the electric junction box 1, as shown in FIG. 1, the cooling members 2A and 2B are respectively disposed on the rear side and the front side of the conductive member 3 so that the pair of cooling members 2A and 2B sandwich the conductive member 3 in the front-rear direction. Next, a gap (see FIG. 4) between an outer surface of the mounting wall 21A of the conductive member 3 and the outer surface of the main body portion 10 of the cooling member 2A, which face each other, and a gap between an outer surface of the mounting wall 21B of the conductive member 3 and the outer surface of the main body portion 10 of the cooling member 2B, which face each other, are filled with a paste-type heat transfer paste 70 having an excellent heat transfer property. Next, the conductive member 3 and the pair of cooling members 2A and 2B are fastened and fixed by using the plurality of bolts 4 inserted into the through holes (not shown) provided in the flange portions 13 of the pair of cooling members 2A and 2B. Accordingly, the assembly of the electric junction box 1 is completed, and the electric junction box 1 shown in FIG. 1 is obtained.

Figure 4:
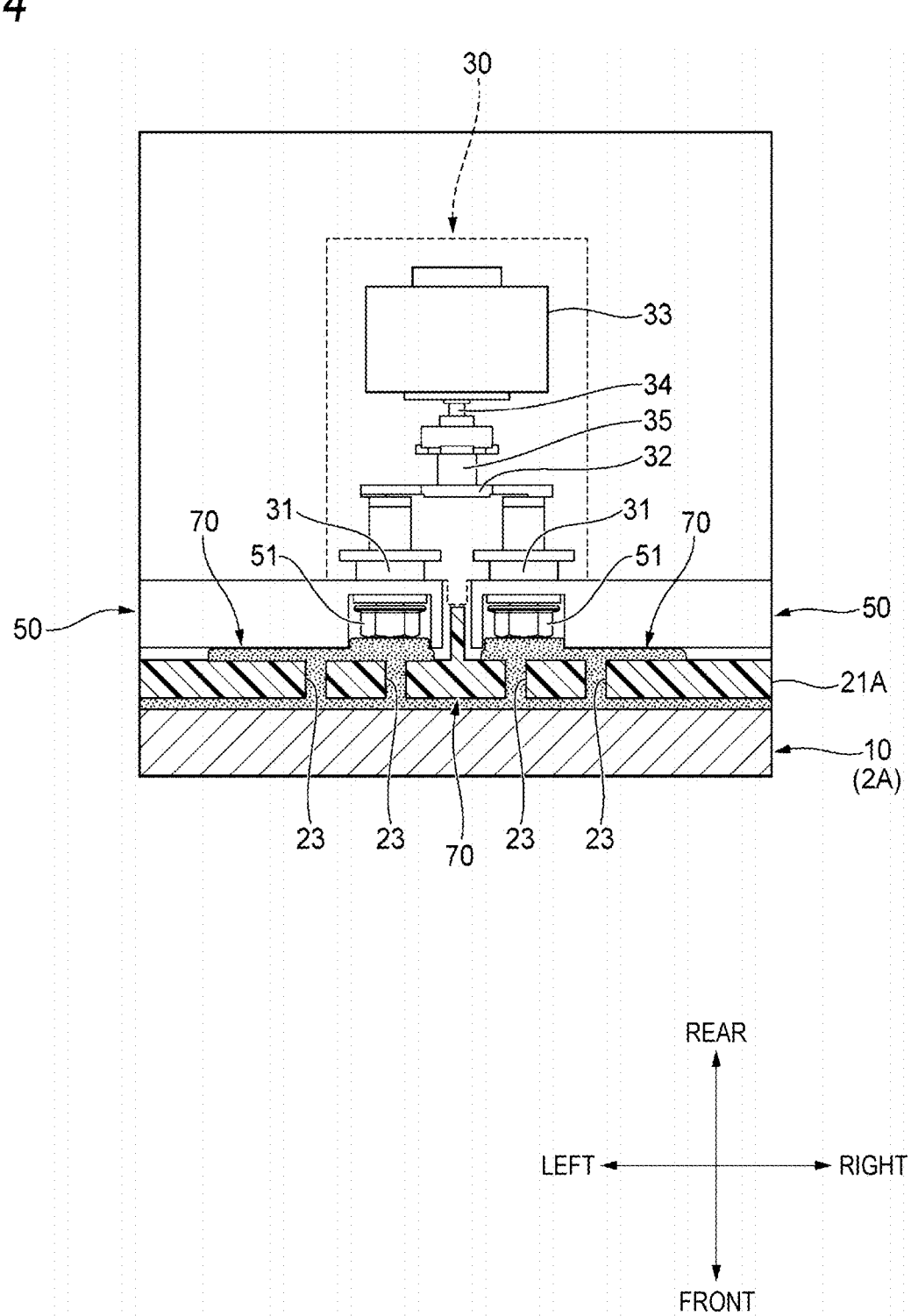
FIG. 4 is a cross-sectional view of the electric junction box shown in FIG. 1 taken along a horizontal plane in the vicinity of a relay disposed inside the housing portion of the conductive member, as seen through the inside of the relay.

In an assembly completion state of the electric junction box 1, as shown in FIGS. 2 and 4, the conductive member 3 is disposed to be sandwiched between the pair of cooling members 2A and 2B such that the outer surfaces of the mounting walls 21A and 21B provided with the busbars 50 respectively face the outer surfaces of the cooling members 2A and 2B. Accordingly, when the conductive member 3 is energized, Joule heat generated in internal circuits (particularly, the movable contact points 32 and the coils 33) of the relays 30, contact points between the relays 30 and the fuse 40 and the busbars 50, and the busbars 50 is easily absorbed by the pair of cooling members 2A and 2B via the mounting walls 21A and 21B and the heat transfer paste 70. Further, the conductive member 3 is disposed to be sandwiched between the pair of cooling members 2A and 2B, and thus a heat absorption capability of the entire electric junction box 1 can be improved as compared with a case in which only one cooling member is used for heat absorption.

Further, in the assembly completion state of the electric junction box 1, as shown in FIG. 4, a part of the heat transfer paste 70 disposed in the gap between the outer surface of the mounting wall 21A and the outer surface of the main body portion 10 of the cooling member 2A, which face each other, passes through the plurality of through holes 23 provided in the mounting wall 21A, spreads to an inner surface side of the mounting wall 21A, and is in contact with the busbars 50 facing the inner surface of the mounting wall 21A (see FIG. 4). Similarly, a part of the heat transfer paste 70 disposed in the gap between the outer surface of the mounting wall 21B and the outer surface of the main body portion 10 of the cooling member 2B, which face each other, passes through the plurality of through holes 23 provided in the mounting wall 21B, spreads to an inner surface side of the mounting wall 21B, and is in contact with the busbars 50 facing the inner surface of the mounting wall 21B. In other words, the heat transfer paste 70 is in contact with both the cooling members 2A and 2B and the busbars 50 via the through holes 23. Accordingly, the Joule heat generated in the internal circuits (particularly, the movable contact points 32 and the coils 33) of the relays 30, the contact points between the relays 30 and the fuse 40 and the busbars 50, and the busbars 50 can be efficiently transferred to the cooling members 2A and 2B via the heat transfer paste 70.

In addition, in the assembly completion state of the electric junction box 1, the plurality of bolts 4 fix the conductive member 3 and the cooling member 2A while applying an external force to cause the conductive member 3 and the cooling member 2A to come close to each other, and fix the conductive member 3 and the cooling member 2B while applying an external force to cause the conductive member 3 and the cooling member 2B to come close to each other. Accordingly, it is possible to maintain a state in which the mounting walls 21A and 21B of the housing portion 20 of the conductive member 3 are respectively disposed close to the outer surfaces of the cooling members 2A and 2B.

Operations and Effects

As described above, according to the electric junction box 1 of the present embodiment, the conductive member 3 including the relays 30, the fuse 40, and the busbars 50 is disposed to be sandwiched between the cooling members 2A and 2B such that the outer surfaces of the mounting walls 21A and 21B of the conductive member 3 provided with the busbars 50 respectively face the outer surfaces of the cooling members 2A and 2B. Accordingly, the Joule heat generated in the internal circuits (particularly, the movable contact points 32 and the coils 33) of the relays 30, the contact points between the relays 30 and the fuse 40 and the busbars 50, and the busbars 50 during the energization is easily absorbed by the cooling members 2A and 2B. Further, the conductive member 3 is disposed to be sandwiched between the cooling members 2A and 2B, and thus the heat absorption capability of the entire electric junction box 1 can be improved as compared with the case in which only one cooling member is used for heat absorption. Therefore, the electric junction box 1 according to the present embodiment has excellent heat dissipation.

Further, the electric junction box 1 is used in a posture in which the outer surface of the cooling member 2A performing the heat absorption and the mounting wall 21A of the conductive member 3 extend in the vertical direction. Accordingly, in the relay 30 connected to the busbars 50 provided on the mounting wall 21A, the terminals 31 and the movable contact point 32 are located to be aligned in a direction (for example, the front-rear direction) intersecting the vertical direction. Therefore, for example, even in the case in which a component (for example, the coil 33) around the movable contact point 32 falls off due to aged deterioration, an excessive external force, or the like, the component falls downward in the vertical direction, and thus it is possible to avoid the component from interfering with the switching between the conductive state and the non-conductive state between the movable contact point 32 and the terminals 31. The same also applies to the busbars 50 provided on the mounting wall 21B.

Further, the heat transfer paste 70 disposed to pass through the through holes 23 of the housing portion 20 of the conductive member 3 is in contact with both the cooling members 2A and 2B and the busbars 50. Accordingly, the Joule heat generated in the internal circuits (particularly, the movable contact points 32 and the coils 33) of the relays 30, the contact points between the relays 30 and the fuse 40 and the busbars 50, and the busbars 50 can be efficiently transferred to the cooling members 2A and 2B via the heat transfer paste 70. Therefore, the electric junction box 1 according to the present embodiment has further excellent heat dissipation.

In addition, the plurality of bolts 4 fix the conductive member 3 and the cooling member 2A while applying the external force to cause the conductive member 3 and the cooling member 2A to come close to each other, and fix the conductive member 3 and the cooling member 2B while applying the external force to cause the conductive member 3 and the cooling member 2B to come close to each other. Accordingly, it is possible to maintain the state in which the mounting walls 21A and 21B of the housing portion 20 of the conductive member 3 are respectively disposed close to the outer surfaces of the cooling members 2A and 2B, and thus it is possible to maintain the excellent heat dissipation over a long period of time.

Other Embodiments

The present disclosure is not limited to the embodiment described above, and various modifications can be adopted within the scope of the present disclosure. For example, the present disclosure is not limited to the embodiment described above, and modifications, improvements, and the like can be made appropriately. In addition, materials, shapes, sizes, numbers, arrangement positions, and the like of components in the above-described embodiment are freely selected and are not limited as long as the present disclosure can be implemented.

Here, the features of the above-described embodiment of the electric junction box 1 will be briefly summarized and listed in the following [1] to [3].

[1] An electric junction box (1) includes:

a first cooling member (2A) and a second cooling member (2B) that are capable of absorbing heat from an outer surface and dissipating heat to the outside; and a conductive member (3) disposed to be sandwiched between the first cooling member (2A) and the second cooling member (2B), in which the conductive member (3) includes a housing portion (20) having a box shape, an electronic component (30, 40) disposed inside the housing portion (20), and busbars (50) that are provided on a first mounting wall (21A) and a second mounting wall (21B) as two box walls of the housing portion (20) and are electrically connected to the electronic component (30, 40), and the conductive member (3) is disposed such that an outer surface of the first mounting wall (21A) faces the outer surface of the first cooling member (2A) and an outer surface of the second mounting wall (21B) faces the outer surface of the second cooling member (2B), and the electronic component (30) includes a plurality of terminals (31) that are provided on a side wall of the electronic component (30) and are connected to the busbars (50), and a movable contact point (32) that is provided inside the electronic component (30) and is capable of mechanically switching a conductive state and a non-conductive state between predetermined terminals among the plurality of terminals (31), and the electronic component (30) is configured in such a manner that the movable contact point (32) is located at a position farther away from the side wall than the plurality of terminals (31) in the electronic component (30).

According to the electric junction box having the configuration of the above [1], the conductive member incorporating the electronic component and the busbars is disposed to be sandwiched between the first cooling member and the second cooling member such that the outer surfaces of the first mounting wall and the second mounting wall of the conductive member provided with the busbars respectively face the outer surfaces of the first cooling member and the second cooling member. Accordingly, the Joule heat, which is generated in the internal circuit of the electronic component, the contact points between the electronic component and the busbars, and the busbars during the energization, is easily absorbed by the first cooling member and the second cooling member through the mounting walls. Further, the conductive member is disposed to be sandwiched between the first cooling member and the second cooling member, and thus the heat absorption capability of the entire electric junction box can be improved as compared with the case in which only one cooling member is used for heat absorption. Therefore, the electric junction box having the present configuration has excellent heat dissipation.

Further, when the electric junction box is used in a posture in which the outer surface of the first cooling member performing the above-described heat absorption and the first mounting wall of the conductive member extend in the vertical direction (the upper-lower direction), the terminals and the movable contact point are disposed to be aligned in the direction (for example, a lateral direction) intersecting the vertical direction in the electronic component connected to the busbar provided on the first mounting wall. Therefore, for example, even in the case in which a component around the movable contact point falls off due to aged deterioration, an excessive external force, or the like, the component falls downward in the vertical direction, and thus it is possible to avoid the component from interfering with the switching of the conductive state and the non-conductive state between the movable contact point and the terminals. The same also applies to the busbar provided on the second mounting wall.

[2] The electric junction box according to the above [1] further includes:

a first heat transfer member (70) configured to transfer heat between the first cooling member (2A) and the conductive member (3), and a second heat transfer member (70) configured to transfer heat between the second cooling member (2B) and the conductive member (3), in which the housing portion (20) has a first through hole (23) penetrating from the inside to the outside of the first mounting wall (21A), and a second through hole (23) penetrating from the inside to the outside of the second mounting wall (21B), the first heat transfer member (70) is disposed to pass through the first through hole (23) and be in contact with both the first cooling member (2A) and the busbar (50) provided on the first mounting wall (21A), and the second heat transfer member (70) is disposed to pass through the second through hole (23) and be in contact with both the second cooling member (2B) and the busbar (50) provided on the second mounting wall (21B).

According to the electric junction box having the configuration of the above [2], the first heat transfer member disposed to pass through the first through hole of the housing portion of the conductive member is in contact with both the first cooling member and the busbar. Accordingly, the Joule heat generated in the contact point between the electronic component and the busbar, and the busbar can be efficiently transferred to the cooling member via the heat transfer member. The same also applies to the second heat transfer member. Therefore, the electric junction box having the present configuration has further excellent heat dissipation.

[3] The electric junction box (1) according to the above [1] further includes:

a first fastening member (4) that fixes the conductive member (3) and the first cooling member (2A) while applying an external force to cause the conductive member (3) and the first cooling member (2A) to come close to each other, and a second fastening member (4) that fixes the conductive member (3) and the second cooling member (2B) while applying an external force to cause the conductive member (3) and the second cooling member (2B) to come close to each other.

According to the electric junction box having the configuration of the above [3], the first fastening member fixes the conductive member and the first cooling member while applying the external force to cause the conductive member and the first cooling member to come close to each other. The same also applies to the second fastening member. Accordingly, it is possible to maintain the state in which the first mounting wall and the second mounting wall of the housing portion of the conductive member are respectively disposed close to the outer surfaces of the first cooling member and the second cooling member, and thus it is possible to maintain the excellent heat dissipation over a long period of time.

The invention claimed is:

1. An electric junction box comprising:
a first cooling member and a second cooling member that are capable of absorbing heat from an outer surface and dissipating heat to the outside; and
a conductive member disposed to be sandwiched between the first cooling member and the second cooling member, wherein:
the conductive member includes a housing portion having a box shape, an electronic component disposed inside the housing portion, and busbars that are provided on a first mounting wall and a second mounting wall as two box walls of the housing portion and are electrically connected to the electronic component, and the conductive member is disposed such that an outer surface of the first mounting wall faces the outer surface of the first cooling member and an outer surface of the second mounting wall faces the outer surface of the second cooling member; and
the electronic component includes a plurality of terminals that are provided on a side wall of the electronic component and are connected to the busbars, and a movable contact point that is provided inside the electronic component and is capable of mechanically switching a conductive state and a non-conductive state between predetermined terminals among the plurality of terminals, and the electronic component is configured in such a manner that the movable contact point is located at a position farther away from the side wall than the plurality of terminals in the electronic component.

2. The electric junction box according to claim 1, further comprising:
a first heat transfer member configured to transfer heat between the first cooling member and the conductive member, and a second heat transfer member configured to transfer heat between the second cooling member and the conductive member, wherein:
the housing portion has a first through hole penetrating from the inside to the outside of the first mounting wall, and a second through hole penetrating from the inside to the outside of the second mounting wall;
the first heat transfer member is disposed to pass through the first through hole and be in contact with both the first cooling member and the busbar provided on the first mounting wall; and
the second heat transfer member is disposed to pass through the second through hole and be in contact with both the second cooling member and the busbar provided on the second mounting wall.

3. The electric junction box according to claim 1, further comprising:
a first fastening member that fixes the conductive member and the first cooling member while applying an external force to cause the conductive member and the first cooling member to come close to each other, and a second fastening member that fixes the conductive member and the second cooling member while applying an external force to cause the conductive member and the second cooling member to come close to each other.

* * * * *